(12) United States Patent
Fukazawa et al.

(10) Patent No.: US 7,506,749 B2
(45) Date of Patent: Mar. 24, 2009

(54) CONVEYING SYSTEM

(75) Inventors: Hiroshi Fukazawa, Kyoto (JP); Masazumi Fukushima, Inuyama (JP); Makoto Yamamoto, Kyoto (JP)

(73) Assignee: Murata Kikai Kabushiki Kaisha, Kyoto (JP)

( * ) Notice: Subject to any disclaimer, the term of this patent is extended or adjusted under 35 U.S.C. 154(b) by 0 days.

(21) Appl. No.: 11/730,981

(22) Filed: Apr. 5, 2007

(65) Prior Publication Data

US 2007/0289844 A1 Dec. 20, 2007

(30) Foreign Application Priority Data

Jun. 14, 2006 (JP) ............................. 2006-164325

(51) Int. Cl.
*B65G 47/18* (2006.01)

(52) U.S. Cl. ................. 198/582; 414/789.9; 414/790.7; 414/220.08

(58) Field of Classification Search ................. 198/580, 198/582; 414/793.5, 788.4, 788.7, 788.8, 414/789.7, 789.9, 790.7, 222.07, 222.08, 414/222.11

See application file for complete search history.

(56) References Cited

U.S. PATENT DOCUMENTS

| | | | | |
|---|---|---|---|---|
| 4,014,430 A * | 3/1977 | Beaty et al. | ................. | 198/588 |
| 4,034,846 A * | 7/1977 | Burgis et al. | ............. | 414/788.9 |
| 4,582,219 A | 4/1986 | Mortensen et al. | | |
| 4,865,515 A * | 9/1989 | Dorner et al. | ............ | 414/788.2 |
| 5,010,715 A * | 4/1991 | Fluck | ...................... | 414/788.7 |
| 5,290,141 A * | 3/1994 | Grinager | .................. | 414/790.3 |
| 5,478,202 A * | 12/1995 | Ishii | ......................... | 414/797.5 |
| 5,772,386 A * | 6/1998 | Mages et al. | ................ | 414/411 |
| 5,885,045 A * | 3/1999 | Rush | ...................... | 414/416.03 |
| 5,997,238 A * | 12/1999 | Garrard et al. | .............. | 414/789 |
| 6,176,023 B1 | 1/2001 | Doche | | |
| 6,579,052 B1 * | 6/2003 | Bonora et al. | .......... | 414/222.01 |
| 6,663,340 B1 | 12/2003 | Zeakes et al. | | |

FOREIGN PATENT DOCUMENTS

| | | |
|---|---|---|
| EP | 1 450 393 A2 | 8/2004 |
| EP | 1450393 A2 | 8/2004 |
| EP | 1 627 834 A1 | 2/2006 |
| EP | 1 806 303 A1 | 7/2007 |
| JP | H09-205136 A | 8/1997 |

(Continued)

OTHER PUBLICATIONS

European Search Report dated Oct. 15, 2007 issued in the corresponding European Patent Application No. 07006599.0.

(Continued)

*Primary Examiner*—James R Bidwell
(74) *Attorney, Agent, or Firm*—Westerman, Hattori, Daniels & Adrian, LLP.

(57) ABSTRACT

The present invention provides a conveying system that performs efficient conveyance by using trays each accommodating one workpiece, as a basic conveyor, and fully utilizing this advantage of the trays to allow its conveyance form to be changed as required. The conveying system includes a single-pod conveyor 10 for conveying pods 5 one by one, a pod stacker 50 for stacking a plurality of pods 5, a stacked pod conveyor 60 for conveying the stacked pods 5, and a pod destacker 50 for destacking the stacked pods.

7 Claims, 8 Drawing Sheets

FOREIGN PATENT DOCUMENTS

| | | |
|---|---|---|
| JP | H10-291645 A | 11/1998 |
| JP | H10-305925 A | 11/1998 |
| JP | 2003-86668 A | 3/2003 |
| JP | 2005-191419 A | 7/2005 |
| WO | WO 99/36787 | 2/1999 |
| WO | WO 99/36787 A | 7/1999 |
| WO | WO 2005/006407 A | 1/2005 |
| WO | WO 2005/006407 A1 | 1/2005 |
| WO | WO 2006/046580 A1 | 5/2006 |

OTHER PUBLICATIONS

European Search Report dated Oct. 15, 2007 issued in the corresponding European Patent Application No. EP 07006598.2.

U.S. Appl. No. 11/730,768, filed Apr. 4, 2007.

Notification of Reason(s) for Refusal, dated Apr. 30, 2008, of the Japanese Patent Application No. 2006-164325 from the Japanese Patent Office.

* cited by examiner

CONVEYING SYSTEM

FIELD OF THE INVENTION

The present invention relates to conveying systems which are provided in factories manufacturing semiconductor substrates, liquid crystal display panels or the like and which, in order to allow plate-like workpieces (semiconductor wafers or glass plates) used as raw materials for semiconductor substrates to undergo various processing treatments in clean rooms, convey pods each containing a plurality of stacked trays each containing one plate-like workpieces.

BACKGROUND OF THE INVENTION

In factories that manufacture semiconductor substrates, liquid crystal display panels or the like, it is necessary to keep plate-like workpieces (semiconductor wafers or glass plates) used as raw materials, as planar as possible and to avoid damage to the workpieces. It is also necessary to enable the workpieces to be stacked and to minimize a stacking height in order to save a handling space. To meet these requirements, proposals have been made of trays that contain these plate-like workpieces (hereinafter also simply referred to as "workpieces").

Further, the Unexamined Japanese Patent Application Publication (Tokkai) No. 2005-191419 (FIGS. 1 to 4) proposes a storage container that accommodates stacked trays. The storage container (hereinafter referred to as the "pod") does not fully utilize this advantage of the trays of allowing stacking height to be reduced to a fraction of that of conventional cassettes that accommodate workpieces on stages.

On the other hand, in connection with conveyance of trays, that is, workpieces, the above factories have been requesting development of a system that can deal with multiproduct small lots to improve conveyance efficiency, that is, a system that can perform efficient conveyance by allowing its conveyance form to be changed as required.

SUMMARY OF THE INVENTION

An object of the present invention is to solve the above problems to provide a conveying system that performs efficient conveyance by using trays each accommodating one workpiece, as basic conveying means, and fully utilizing this advantage of the trays to change a conveyance form as required.

A conveying system is characterized by comprising a single-pod conveying means for conveying pods one by one, a pod stacking means for stacking a plurality of pods, a stacked pod conveying means for conveying the stacked pods, and a pod destacking means for destacking the stacked pods.

A conveying system is characterized by further comprising a tray loading and unloading means for loading and unloading a plurality of stacked trays into and from a pod.

A conveying system is characterized by further comprising a tray stacking and destacking means for stacking a plurality of trays or destacking the plurality of stacked trays.

The conveying system comprises the single-pod conveying means for conveying pods one by one, the pod stacking means for stacking a plurality of pods, the stacked pod conveying means for conveying the stacked pods, and the pod destacking means for destacking the stacked pods. The conveying system can thus efficiently convey the workpieces by allowing its conveyance form to be changed as required.

The conveying system further comprises the tray loading and unloading means for loading and unloading a plurality of stacked trays into and from a pod. Consequently, in addition to exerting the effects, the conveying system allows trays to be efficiently conveyed in a clean state.

The conveying system further comprises the tray stacking and destacking means for stacking a plurality of trays or destacking the plurality of stacked trays. Consequently, in addition to exerting the effects, the conveying system allows its conveyance form to be changed for each pod or tray, enabling more efficient conveyance.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

An embodiment (working example) of the present invention will be described below with reference to the drawings.

Figure 1A:
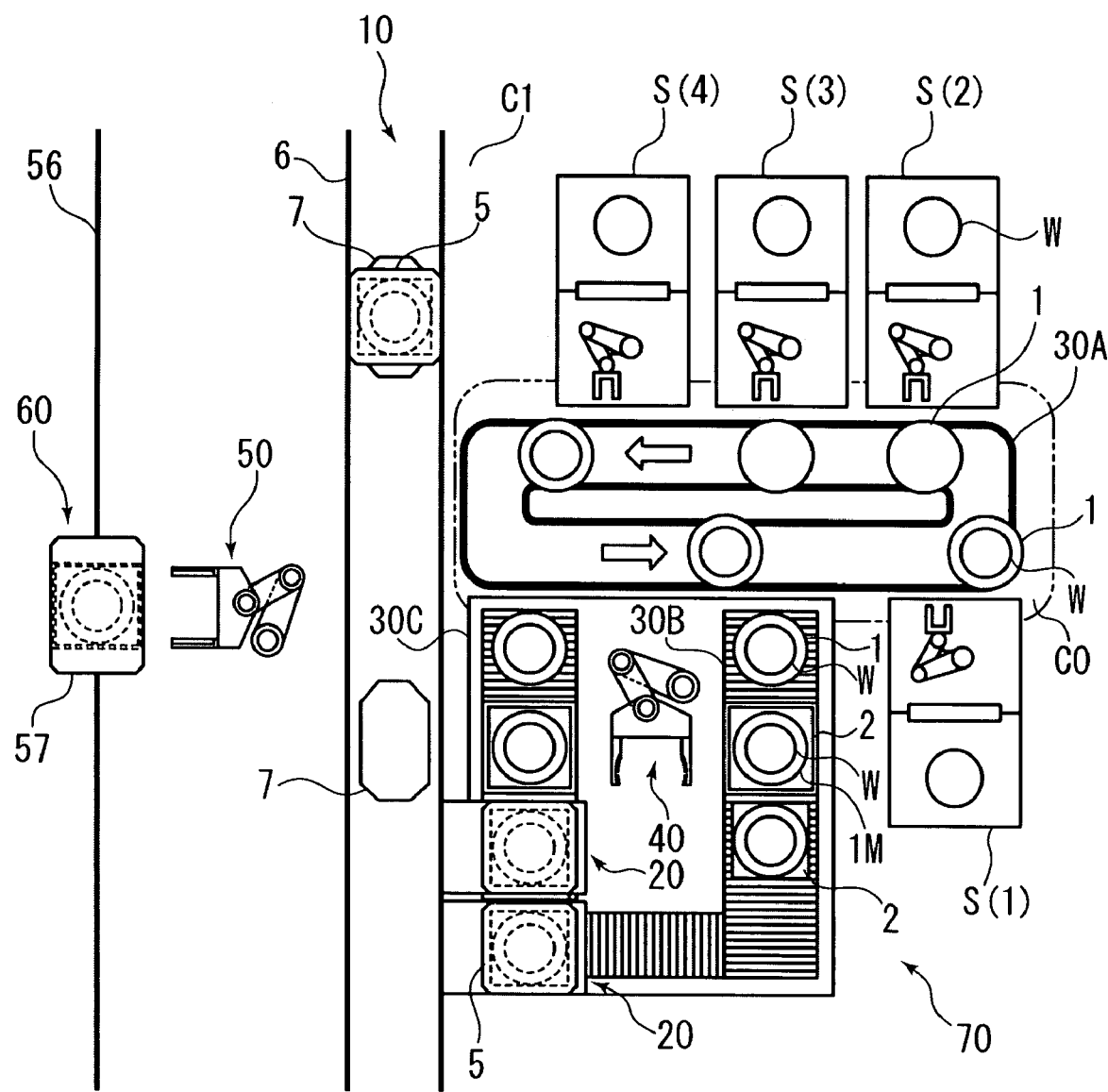
FIG. 1A is a general layout conceptually showing an example of a conveying system in accordance with the present invention.
Figure 1B:
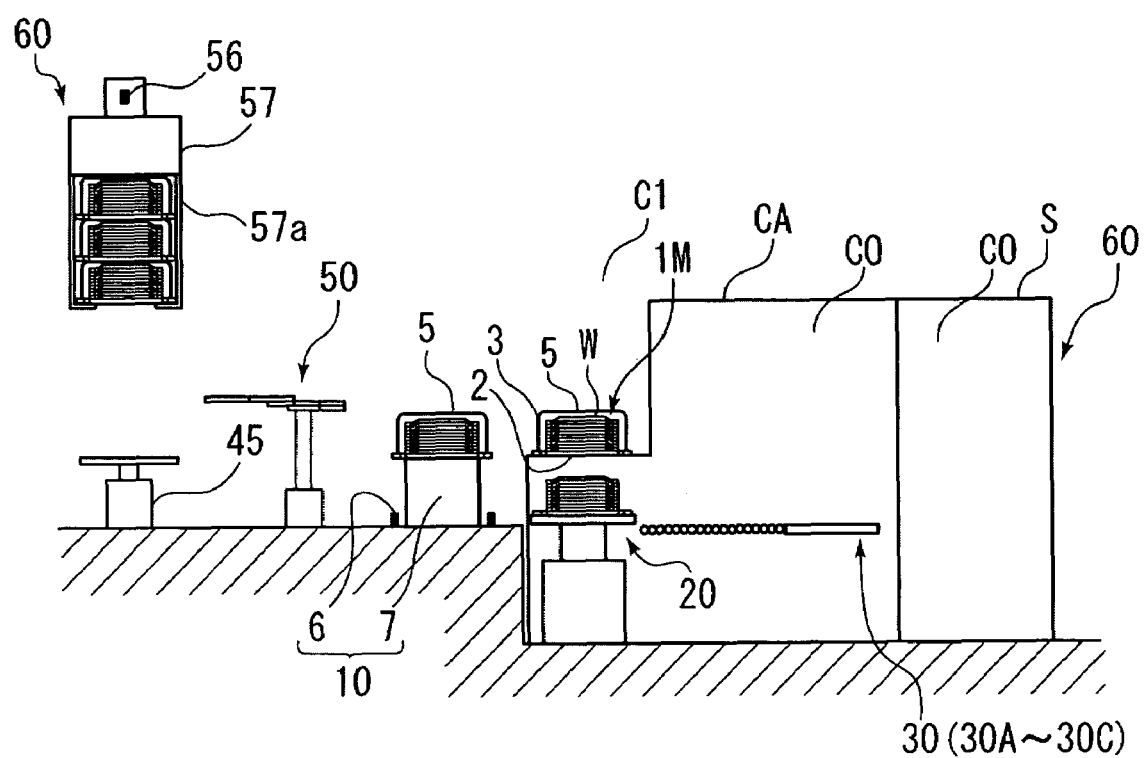
FIG. 1B is a sectional view of an essential part of FIG. 1A.

FIG. 1A is a general layout conceptually showing an example of a conveying system in accordance with the present invention. FIG. 1B is a sectional view of an essential part of the conveying system.

A conveying system 70 shown in the figures is provided in a factory manufacturing semiconductor substrates, liquid crystal display panels or the like. To allow plate-like workpieces (semiconductor wafers or glass plates) used as raw materials for semiconductor substrates to undergo various processing treatments in a clean room, the conveying system 70 conveys, in an intra-process case, a plurality of the plate-like workpieces each contained in a tray 1, at a time or one by one, and in an inter-process case, pods 5 each containing a plurality of stacked trays 1, one by one.

A description will be given below of an example in which in a factory manufacturing semiconductor substrates, the conveying system handles plate-like workpieces W (hereinafter also simply referred to as "workpieces") that are circular semiconductor wafers contained in a similarly circular tray 1. However, the shapes of the workpieces and tray to which the present invention is related are not limited to those described above.

The conveying system 70 comprises the trays 1 each containing one workpiece W a bottom lid 2 on which a plurality of stacked trays 1 are placed, a top shell 3 airtightly installed on the bottom lid 2 from above, with a plurality of the trays 1 stacked on the bottom lid 2 (a tray housing container composed of the bottom lid 2 and the top shell 3 is called a pod 5), a single-pod conveying means 10 for conveying the pods 5 one by one, and a tray loading and unloading means 20 for loading and unloading a plurality of stacked trays into and from the pod 5

The conveying system 70 further comprises a tray conveying means 30 for conveying the trays 1, a tray stacking and destacking means 40, a pod stacking and destacking means 50 for stacking a plurality of pods 5 and destacking the stacked pods 5, and a stacked pod conveying means 60 for conveying the stacked pods 5.

In the figures, a reference character S is a processing treatment station in which the conveying system 70 is installed to execute one of the processing treatments for a semiconductor manufacturing process. Processing treatment stations are denoted as S(1), . . . , S(4), S(5), and so on counterclockwise from the left end of the lower stage in the figure.

The processing treatment station S takes the workpiece W out of the tray 1, executes a predetermined processing treatment on the workpiece W, and then returns the workpiece W to the tray 1.

The pod 5, composed of the tray 1, bottom lid 2, and top shell 3 will be described below in detail with reference to FIG. 2.

The single-pod conveying means 10 comprises a route 6 and a vehicle 7 that travels along the route 6 and on which the pod 5 is mounted. The single-pod conveying means 10 conveys a certain number of the workpieces W, that is, the tray 1, between each of the processing treatment processes. Specifically, the pod conveying means 10 conveys each pod 5 containing a plurality of the stacked trays 1 each containing one workpiece W; the plurality of stacked trays 1 are denoted as 1M.

Accordingly, although the single-pod conveying means 10 is used in an inter-process conveying space C1 that is a clean environment with a relatively low cleanliness, it is not contaminated with particles (particle such as dust) in the inter-process conveying space C1 with a low cleanliness because the workpieces W and the trays 1 are contained in the airtight pod 5 during conveyance.

The tray loading and unloading means 20 will be described below with reference to FIG. 3.

Tray conveying means 30 comprises a tray conveying means 30A for conveying the tray 1 to each of the processing treatment stations S(1) to S(4), a tray conveying means 30B for conveying the tray 1 from the tray loading and unloading means 20 to the tray conveying means 30A, and a tray conveying means 30C for conveying the tray 1 from the tray conveying means 30A to the tray loading and unloading means 20. Trays are transferred to and from tray conveying means 30A by tray stacking and destacking means 40.

As the tray conveying means 30, a roller conveyor, a belt conveyor or the like may be used. However, the present invention is not limited to this and the tray conveying means 30 has only to be able to smoothly convey the tray 1, including its curved portion, in the clean environment.

The tray conveying means 30 may convey the trays 1 one by one (one-by-one conveyance) or may convey a plurality of the stacked trays 1 at a time.

The tray stacking and destacking means 40 will be described below with reference to FIG. 4.

The pod stacking and destacking means 50 can grip and move one pod 5 from any place to any other place. The pod stacking and destacking means 50 comprises a pod mount 45 on which the stacked pods conveyed by the stacked pod conveying means 60 are temporarily placed. The pod stacking and destacking means 50 destacks the stacked pods 5 one by one and places each of the destacked pods 5 on the vehicle 7 of the single-pod conveying means 10. The pod stacking and destacking means 50 will be described in detail with reference to FIG. 5.

The stacked pod conveying means 60 is of an overhead traveling type and comprises a traveling rail 56 provided on the ceiling and an overhead vehicle 57 automatically controlled to travel along the traveling rail 56.

The overhead vehicle 57 comprises an elevating and lowering arm 57a that elevates and lowers and that supports a bottom lid 2 of the lowermost one of the stacked pods 5. This allows a plurality of stacked pods 5 to be conveyed.

Like in each of the processing treatment stations S(1) to S(4), the space in which the tray loading and unloading means 20, the tray conveying means 30, and the tray stacking and destacking means 40 are provided offers a higher cleanliness than the inter-process conveying space C1 with a low cleanliness, in which the single-pod conveying means 10, the pod stacking and destacking means 50, and the stacked pod conveying means 60 are provided. The former space is called an intra-process conveying space C0.

Figure 2A:
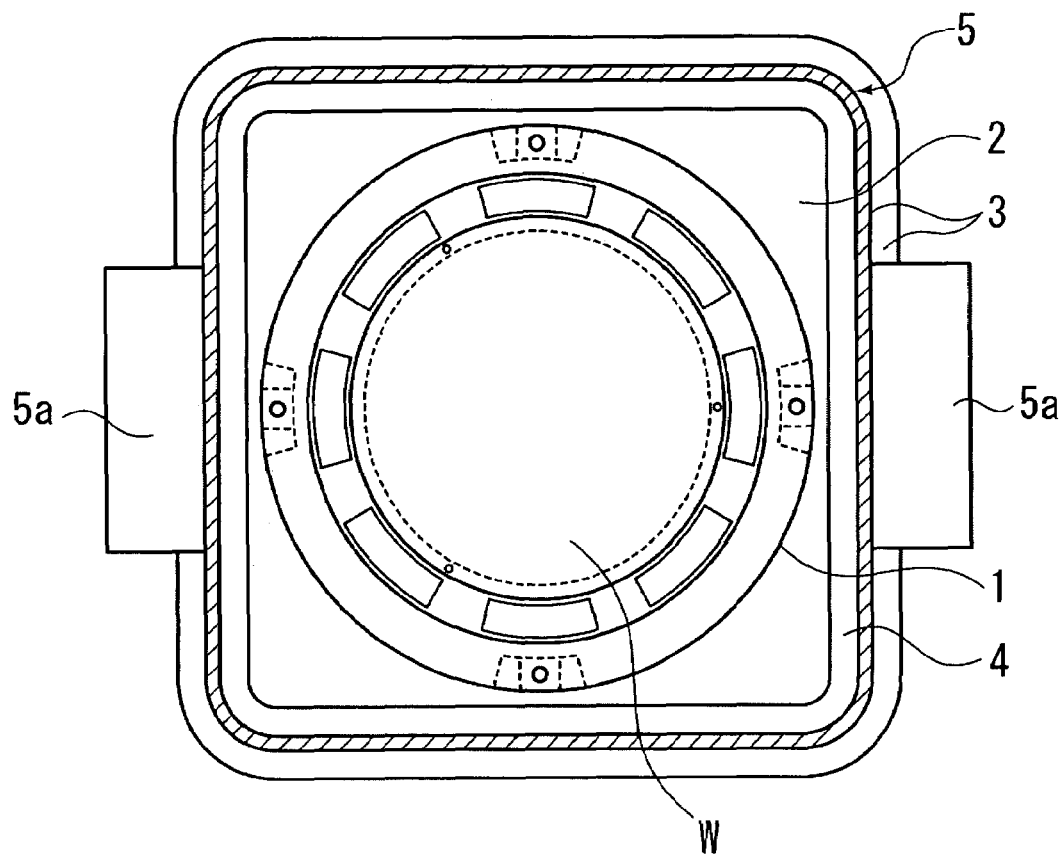
FIG. 2A is a diagram conceptually showing a cross section of a pod in FIG. 1.
Figure 2B:
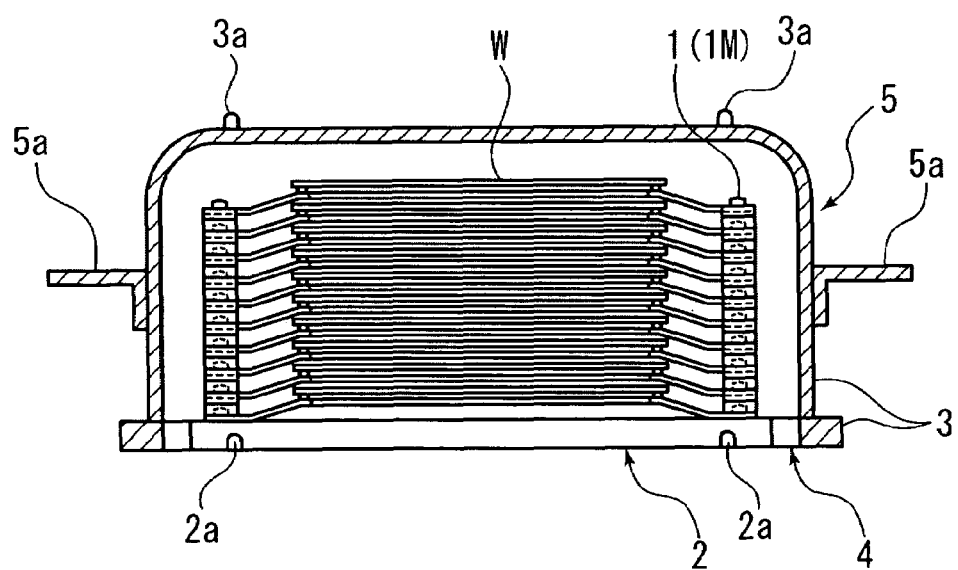
FIG. 2B is a diagram conceptually showing a longitudinal section of FIG. 2A.
Figure 2C:
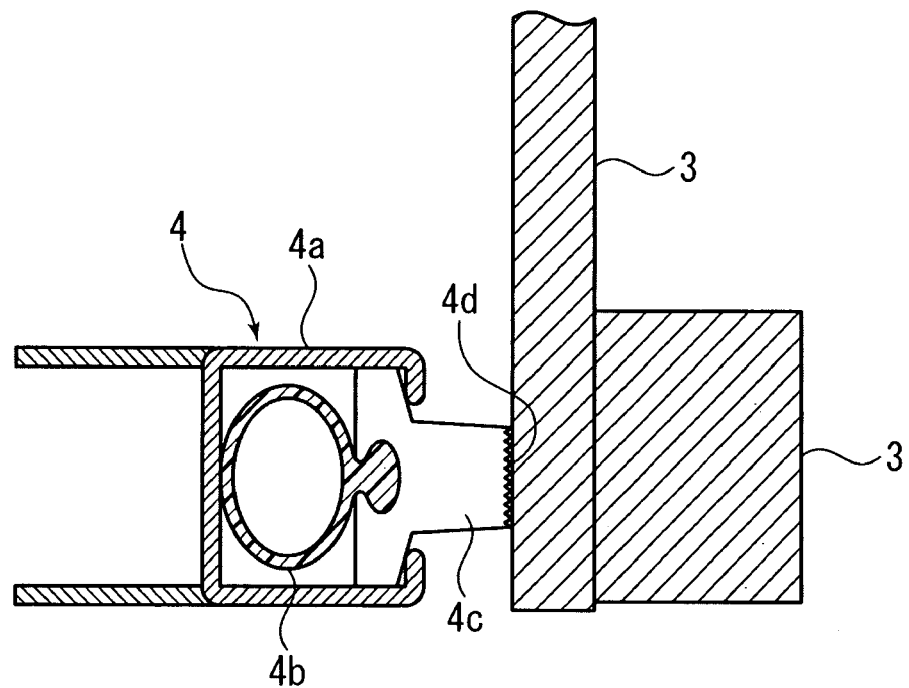
FIG. 2C is a detailed diagram of an essential part of the pod in FIG. 2A with its bottom lid closed.
Figure 2D:
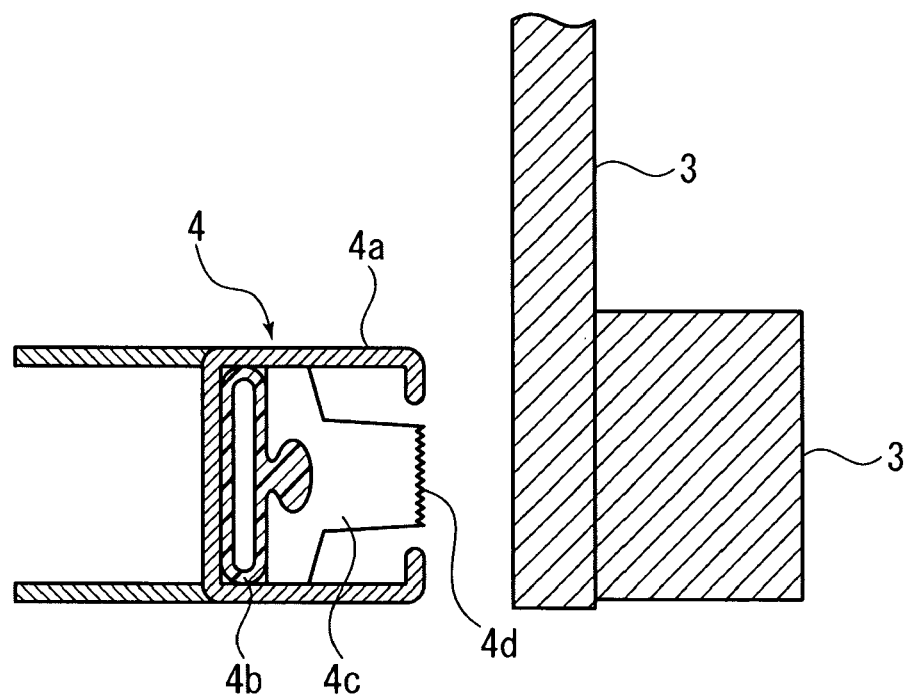
FIG. 2D is a detailed diagram of an essential part of the pod in FIG. 2A with its bottom lid open.

FIG. 2A is a conceptual cross section of the pod in FIG. 1. FIG. 2B is a conceptual longitudinal section of the pod in FIG. 2A. FIG. 2C is a detailed diagram of an essential part of the pod 5 with its bottom lid 2 closed. FIG. 2D is a detailed diagram of the essential part of the pod 5 with its bottom lid 2 open. The already described parts are denoted by the same reference numerals, with duplicate descriptions omitted.

The bottom lid 2, constituting the pod 5, is shaped like a square. A plurality of the stacked trays 1 can be placed on the bottom lid 2, and an air tube seal means 4 is provided along the four outer edges of the bottom lid 2.

The air tube seal means 4 comprises a housing cylinder 4a surrounded by a square cylinder with one side partly open, an air tube 4b contained in the housing cylinder 4a and which contracts and expands, and a seal 4c having a projecting portion 4d which, in conjunction with the contraction or expansion of the air tube 4b, moves between an inner position and a projecting position relative to an opening portion of the housing cylinder 4a.

Fitting recesses 2a are formed on the underside of the bottom lid 2, that is, opposite the side on which the tray 1 is placed. The fitting recesses 2a are used to position the pods 5 relative to each other in a horizontal direction when the pods 5 are stacked in a vertical direction.

The top shell 3 is a structure having a sufficient strength to withstand even the vertically stacked pods 5 each containing the tray 1. The top shell 3 itself can be kept airtight.

The lower opening in the top shell 3 is shaped to extend along the outer edge of the bottom lid 2, including the air tube seal means 4. A gap is formed between the inner edge of the lower opening and the outer edge of the bottom lid 2, and has such a size as does not hinder the free flow of air. The gap is opened and closed by the air tube seal means 4.

Fitting projections 3a are provided at an upper edge of the top shell 3 in association with the fitting recesses 2a in the bottom lid 2 to allow the pods 5 to be positioned in the horizontal direction when the pods 5 are stacked in the vertical direction.

The top shell 3 has a handle 5a projected from its side surface. The handle 5a is used to allow an operator to, for example, lift the pod 5 by holding its part other than the bottom lid 2. For example, when the pod 5 containing the tray 1 is not so heavy, the handle 5a can be conveniently used to manually lift the pod 5 at the work site. However, the handle 5a may be omitted if it is unnecessary.

The height of the top shelf 3 can be freely varied in response to the number of stacked trays 1 to be contained in the pod 5. In this case, the gap between the top shelf 3 and the bottom lid 2 (including the air tube seal means 4) allows any top shelf 3 to be used for the same bottom lid 2; the height of the top shell 3 can be varied without relying on the bottom lid 2. This increases the degree of freedom of the height of the pod 5, that is, the degree of freedom of the number of trays 1 contained in the pod 5.

Such a high degree of freedom cannot be provided by a conventional side-open cassette having a plurality of shelf plates on which workpieces are placed.

Further, the tray 1 used in this case has a structure described below with reference to FIG. 4 to enable the stacking height of the workpieces W to be reduced to a fraction of that of the conventional cassette. This enables the height of the top shell 3 required to accommodate the same number of workpieces W in the prior art to be reduced to a fraction.

Thus, the idea of the inventors of the conveying system in accordance with the present invention is such that instead of simply increasing the number of trays 1 (or workpieces W) accommodated by setting the height of the top shell 3 similar to that of the conventional cassette, the above characteristics of the tray 1 are utilized to allow a small number of workpieces as a basic unit to be contained in one pod 5 and to allow a plurality of stacked pods 5 to conveyed as required for conveyance, improving conveyance efficiency.

In this case, the fitting recesses 2a, formed in the bottom lid 2 of the above described pod 5, and the fitting projections 3a, provided on the top shell 3, enable stacked pods 5 to be positioned in a horizontal direction to prevent them from being displaced in the horizontal direction during stacked conveyance. This enables the stacked pods 5 to be conveyed safely and reliably.

That is, the pod 5 in accordance with the present invention has the combination of the bottom lid 2, on which a plurality of the above trays 1 are stacked, and the top shell 3, which is compatible with the bottom lid 2 but can maintain airtightness, through the use of the air tube seal means 4. This makes it possible to deal with multiproduct small lots to improve conveying efficiency, as described above. That is, the conveyance form can be changed as required, enabling efficient conveyance.

Figure 3A:
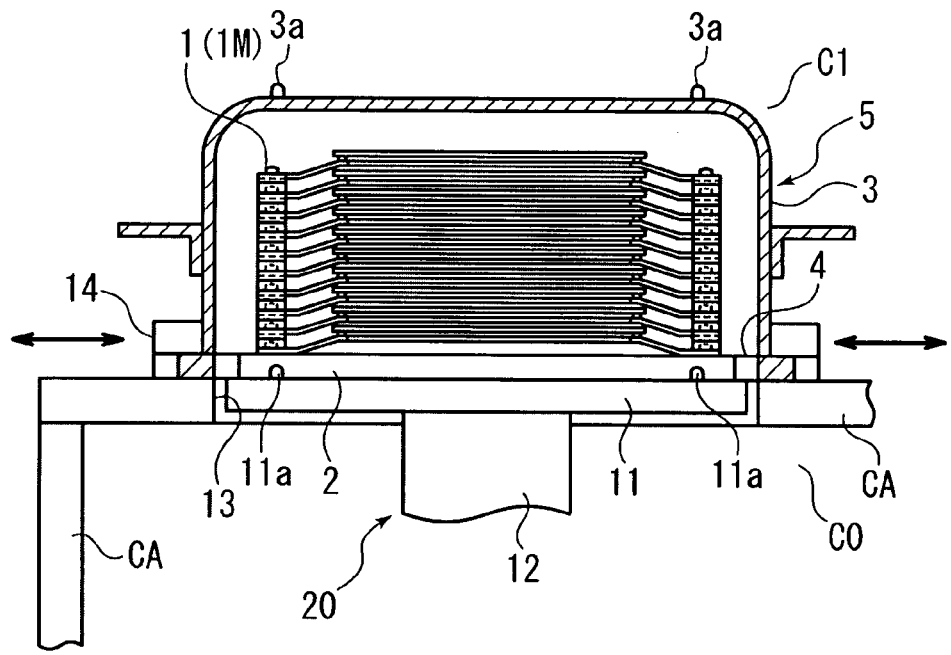
FIG. 3A and FIG. 3B are diagrams illustrating the operations and effects of a tray loading and unloading means in FIG. 1.
Figure 3B:
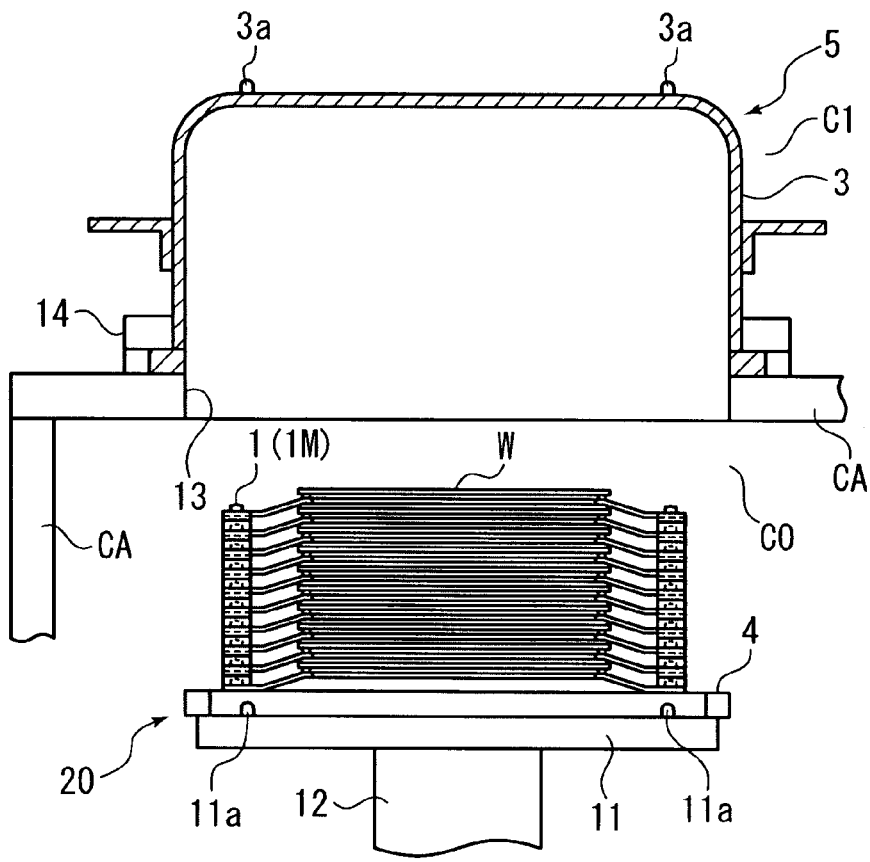

FIG. 3A and FIG. 3B are diagrams illustrating the operation and effects of the tray loading and unloading means 20 in FIG. 1.

In the present invention, since the pod 5 itself allows a plurality of the trays 1 to be stacked on the bottom lid 2 and also allows the bottom lid 2 and top shell 3 to be easily unsealed and separated from each other without any resistance through the use of the air tube seal means 4 described above, the tray loading and unloading means 20, which loads and unloads the tray 1M, has only to have a very simple structure that elevates and lowers the bottom lid 2, as seen in FIG. 1B.

Here, the structure of the tray loading and unloading means 20 is specifically shown. The tray loading and unloading means 20 has a pod receiving plate 11 provided on elevating and lowering means 12 that can be ordinarily used in clean rooms and fitting the bottom lid 2 of the pod 5.

Since the bottom lid 2 has the fitting recesses 2a, the pod receiving plate 11 preferably has a fitting protrusions Ha that fit the fitting recesses 2a. This allows the tray loading and unloading means 20 and the pod 5 to be reliably positioned in the horizontal direction.

Further, the tray loading and unloading means 20 is provided on a horizontal part of a partition wall CA that separates the inter-process conveying space C1 with a lower cleanliness from the intra-process conveying space C0 with a higher cleanliness. The pod receiving plate 11 fits into an opening 13 in the tray loading and unloading means 20.

A retainer plate 14 is provided around the periphery of the opening 13; the retainer plate 14 holds a lower edge of the top shell 3 of the pod 5 placed on the pod receiving plate 11 and is movable forward and backward.

The tray loading and unloading means 20 configured as described above operates as described below to exert certain effects.

When the pod 5 is placed in the area of the partition wall CA in which the tray loading and unloading means 20 is disposed, the top shell 3 is fixed by the retainer plate 14. In this state, the bottom lid 2 of the pod 5 is also placed on the pod receiving plate 11 of the tray loading and unloading means 20.

Then, the bottom lid 2 and the top shell 3 are unsealed through the use of the air tube seal means 4 to allow the bottom lid 2 to be separated from the top shell 3 without any resistance. This state is shown in FIG. 3A.

Then, when the elevating and lowering means 12 lowers the pod receiving plate 11, the conveying system is brought into the state shown in FIG. 3B. The trays 1M stacked on the bottom lid 2 are thus taken out and placed in the intra-process conveying space C0 with a higher cleanliness. That is, the tray loading and unloading means 20 allows the trays 1 to be very easily taken out of and placed in the pod 5.

In this case, the bottom lid 2 lowers to open the lower opening in the upper shell 3, so that a negative pressure is likely to be generated inside the top shell 3. However, the generation of a negative pressure can be prevented by the gap between the contracted air tube seal means 4 and the top shell 3, which has such a size as does not resist the flow of air. This further makes it possible to inhibit particles carried by an air current caused by the negative pressure from being attached to the trays 1M inside the top shell 3 or the workpieces W contained in each tray 1.

Further, the air current is generated in the intra-process conveying space C0 with a higher cleanliness. This enables a reduction in the adverse effect of the particles.

That is, the pod 5 and the corresponding single-pod conveying means 10 and tray loading and unloading means 20 in accordance with the present invention allow the exertion of the above effect of the pod 5 and the above effect of the single-pod conveying means 10, which operates in the inter-process conveying space C1 with a lower cleanliness, as well as the above effect of the tray loading and unloading means 20, which moves the trays 1 from the inter-process conveying space C1 to the intra-space conveying space C0. As a whole, handling of each tray 1 can be automated, and the trays 1 can be efficiently conveyed in a clean state.

With the bottom lid 2 removed, the top shell 3 serves as the partition wall CA between the inter-process conveying space C1 and the intra-process conveying space C0. This inhibits the flow of air between the inter-process conveying space C1 and the intra-process conveying space C0 to prevent the cleanliness of the intra-process conveying space C0 from being affected by the cleanliness of the inter-process conveying space C1.

Further, the top shell 3 is compatible with the bottom lid 2 as described above. Accordingly, when a plurality of the trays 1 already subjected to processing treatments are stacked on the bottom lid 2 standing by as described above and the bottom lid 2 is thus prepared, then the bottom lid 2 is lifted by the tray loading and unloading means 20 and placed in the top shelf 3 to form a pod 5, which is then conveyed by the pod conveying means 10.

Thus, the pod 5, the combination of the bottom lid 2 and the top shell 3 in accordance with the present invention, which are compatible with each other, is combined with the tray loading and unloading means 20, which elevates and lowers only the bottom lid 2, to enable flexible conveyance utilizing compatibility between the bottom lid 2 and the top shell 3.

Figure 4A:
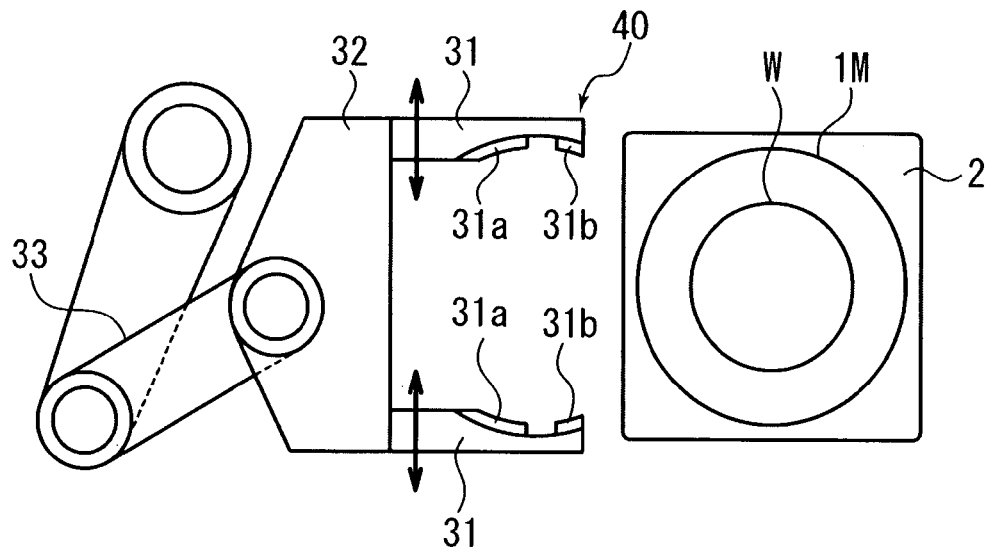
FIG. 4A is a plan view of a tray stacking and destacking means in FIG. 1.
Figure 4B:
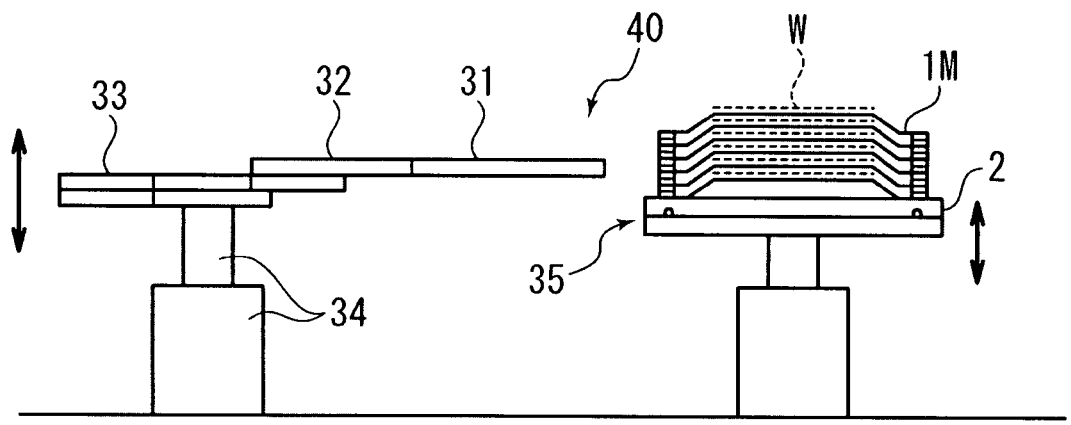
FIG. 4B is a side view of FIG. 4A.
Figure 4C:
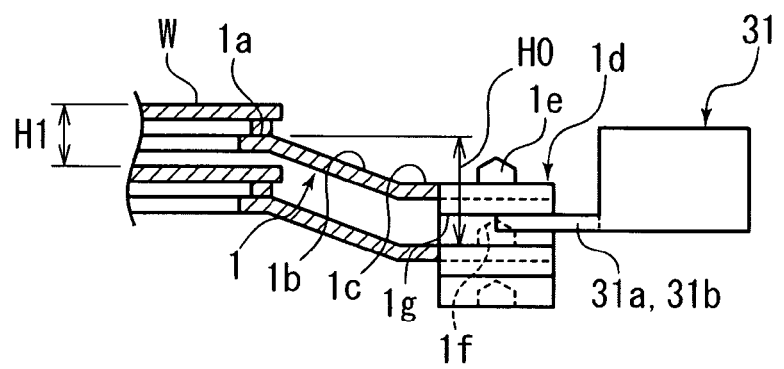
FIG. 4C is a sectional view of an essential part of the tray stacking and destacking means gripping a tray.

FIG. 4A is a plan view of the tray stacking and destacking means 40 in FIG. 1. FIG. 4B is a side view of FIG. 4A. FIG. 4C is a sectional view of an essential part of the tray stacking and destacking means 40 gripping the tray.

The tray stacking and destacking means 40 comprises a pair of a tray gripping means 31 that can grip the trays 1 one by one, a slide holding means 32 for holding the pair of tray gripping means 31 so that the opposite distance between the tray gripping means 31 is variable, a free arm 33 installed at one end of the slide holding means 32 so that the direction of the slide holding means 32 is controllable, and an elevating and lowering means 34 for supporting a base end of the free arm 33 so that the free arm 33 can be elevated and lowered.

Further, the tray stacking and destacking means 40 comprises a bottom lid elevating and lowering means 35 for placing the bottom lid 2 with the stacked trays placed thereon so that the bottom lid 2 can be elevated and lowered. Provided that the tray gripping means 31 is able to elevate and lower, the bottom lid elevating and lowering means 35 need not be able to elevate and lower.

Now, with reference to FIG. 4C, a description will be given of the configuration of an essential part of the tray 1 in accordance with the present invention to which the tray stacking and destacking means 40 is applicable. The tray 1 includes the same essential part of the tray described in the Japanese Patent Application (Tokugan) No. 2005-214156, the applicant's prior application.

The tray 1 as a whole is shaped like a hat with a flange shaped like a circular truncated cone widened toward its end. The tray 1 has an upper side portion 1a on which the workpieces W are placed, an inclined portion 1b that retains the entire structural strength, and a lower side root portion 1c which can grip the tray 1 and to which a stacking block 1d is assembled.

The stacking block 1d comprises a fitting projection 1e and a fitting recess 1f which are used to position the vertical trays 1 to be stacked and the stacking block 1d, and a gripping notch portion 1g that forms a predetermined gap between the upper stacking block 1d and the lower stacking block 1d.

When the trays 1 are stacked, only the stacking blocks 1d receive the load of the stacked trays 1. This prevents the workpieces W placed on the tray 1 from being affected.

The inclined portions 1b of the upper and lower trays 1 mate with each other, while retaining the strength of the trays 1. This enables the height H1 of the stacked workpieces W to be set smaller than the height H0 of the tray 1 itself.

The inclined portion 1b retains the strength of the tray 1, and the stacking block 1d has the gripping notch portion 1g. Thus, fitting the gripping protrusions 31a, 31b of the tray gripping means 31 into the gripping notch portion 1g enables the single tray 1 to be gripped without deforming the tray 1 or affecting the workpieces W placed on the tray 1.

Further, in this case, even if a plurality of the trays 1 are stacked on the gripped tray 1, gripping of the tray 1 can be achieved with the plurality of trays 1 remaining stacked state without being affected by these trays 1.

Moreover, enabling this method for gripping eliminates the need for the gap between the upper and lower workpieces W, which is required where the workpieces W are directly gripped; in the latter case, the gap is required to allow taking-out means to move in and out so that the entire surfaces of the workpieces W can be placed on the taking-out means, in order to reduce deformation of the workpieces W.

As a result, as described above, the use of the trays 1 enables the stacking height to be reduced to a fraction of that of the conventional cassette, with which each workpiece W is placed directly on the corresponding stage.

As is obvious from the above description, when the trays 1 are stacked and destacked by the tray stacking and destacking means 40, the tray gripping means 31 may have a predetermined height so that its gripping protrusions 31a, 31b can enter the gripping notch portion 1g to allow the trays 1 to be gripped one by one before stacking or destacking.

In this case, in connection with the number of trays 1 staked on the gripped tray 1, any number of trays 1, for example, two or three trays, can be stacked or destacked.

The tray stacking and destacking means 40 is provided between the tray conveying means 30 and the pod conveying means 10 to enable the selection of conveyance of one unit of the trays 1 (including one-by-one conveyance) or bulk conveyance using the pod 5 (conveyance of a given number of trays 1 at a time).

Where the trays 1 at any vertical positions are to be selectively destacked from the stacked trays 1M by the tray stacking and destacking means 40, another tray stacking and destacking means 40 may be installed so that after one of the tray stacking and destacking means 40 picks up a plurality of undesired upper trays 1, the other tray stacking and destacking means 40 can grip and destack a desired number of trays 1.

Alternatively, with the single tray stacking and destacking means 40, a temporary placement area may be prepared so that the undesired trays 1 are temporarily transferred to the temporary placement area, the desired trays 1 can be destacked.

Figure 5A:
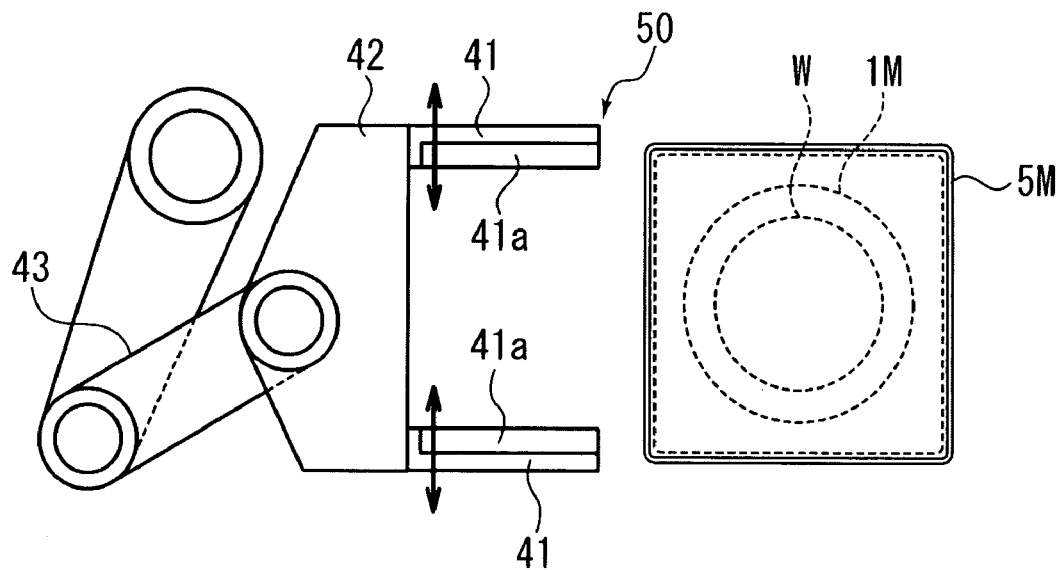
FIG. 5A is a plan view showing a pod stacking and destacking means in FIG. 1.
Figure 5B:
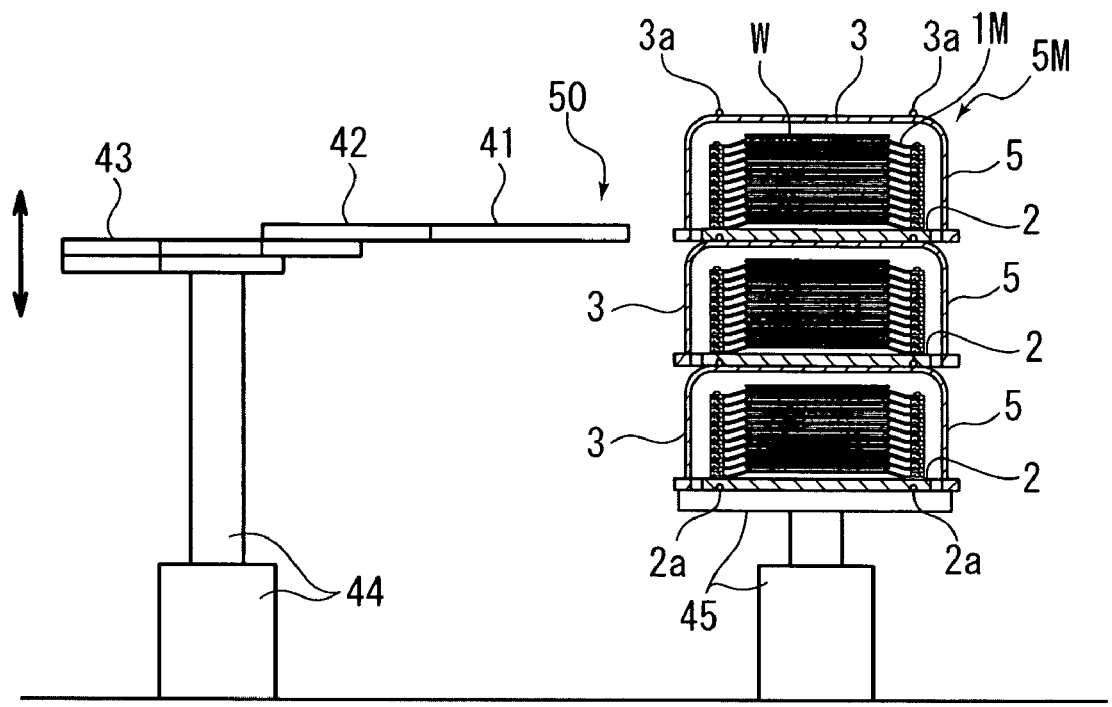
FIG. 5B is a side view of FIG. 5A.
Figure 5C:
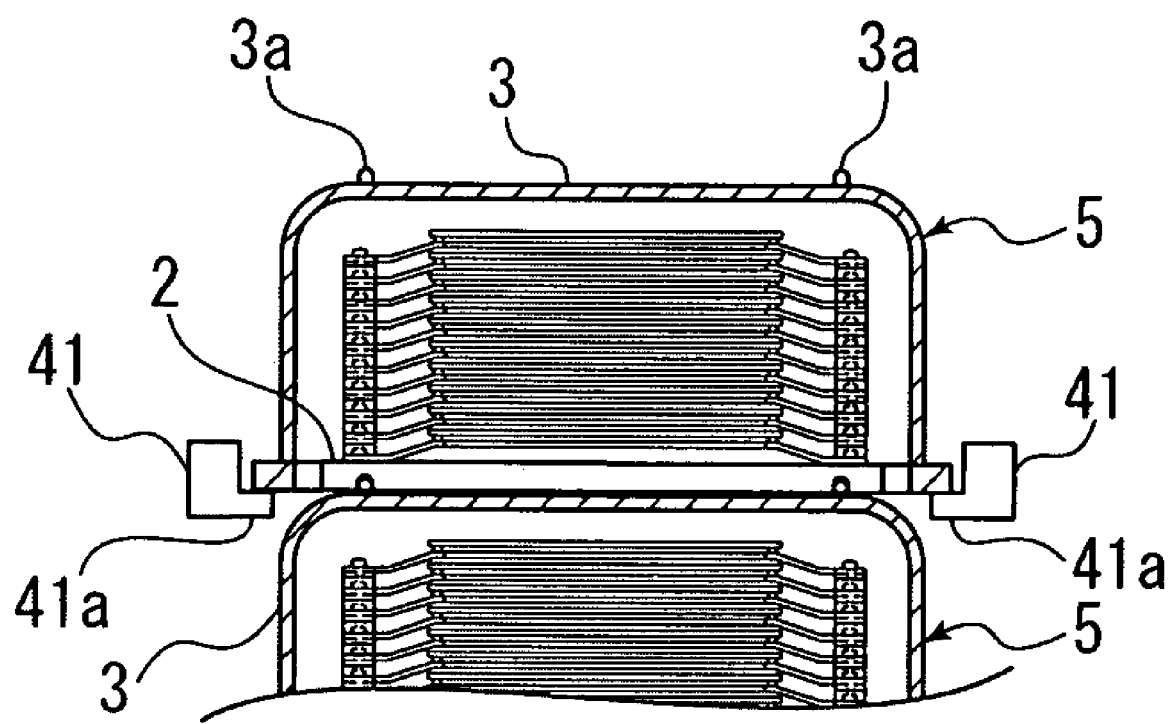
FIG. 5C is a diagram of an essential part of the pod stacking and destacking means gripping a pod.

FIG. 5A is a plan view showing the pod stacking and destacking means 50. FIG. 5B is a side view of FIG. 5A. FIG. 5C is a diagram of an essential part of the pod stacking and destacking means 50 gripping a pod.

The pod stacking and destacking means 50 comprises a pair of a pod gripping means 41 capable of gripping the pods 5 one by one, a slide holding means 42 for holding the pair of pod gripping means 41 so as to be able to vary the opposite distance between the pod gripping means 41, a free arm 43 installed at one end of the slide holding means 42 so as to be able to control the direction of the slide holding means 42, and an elevating and lowering means 44 for supporting a base end of the free arm 43 so as to be able to elevate and lower the free arm 43.

The pod stacking and destacking means 50 comprises the pod mount 45 which can elevate and lower, and on which the stacked pods 5 conveyed by the stacked pod conveying means 60 are temporarily placed. However, provided that the pod gripping means 41 can elevate and lower, the pod mount 45 need not be able to elevate and lower.

When the stacked pod stacking means 50 stacks or destacks the pods 5, the pod gripping means 41 is set at a predetermined height so as to place its gripping projection 41a under the bottom lid 2 of the pod 5 to grip the pods 5 one by one for stacking or destacking.

In this case, in connection with the number of pods 5 staked on the gripped pod 5, any number of pods 5, for example, two or three pods, can be stacked or destacked.

Since the pod stacking and destacking means 50 is provided between the stacked pod conveying means 60 and the single-pod conveying means 10. This makes it possible to select either single-pod conveyance in which the pods 5 are conveyed one by one or bulk conveyance in which a required number of stacked pods are conveyed at a time, as required.

That is, the conveying system 70 configured as described above in accordance with the present invention uses the tray 1 accommodating one workpiece W, as basic conveying means, to enable the pods 5 each containing a plurality of stacked trays 1 to be conveyed one by one or in a stacked form. This enables the advantages of the trays 1 to be fully utilized to change the conveyance form as required, allowing the workpieces W to be efficiently conveyed.

Where the pods 5 at any vertical positions are to be selectively destacked from stacked pods 5M by the pod stacking and destacking means 50, another pod stacking and destacking means 50 may be installed so that after one of the pod stacking and destacking means 50 picks up a plurality of undesired upper pods 5, the other pod stacking and destacking means 50 can grip and destack a desired number of trays 1.

Alternatively, with the single pod stacking and destacking means 50, a temporary placement area may be prepared so that after the undesired pods 5 are temporarily transferred to the temporary placement area, the desired pods 5 can be destacked.

Further, in the description of this example, the pod stacking and destacking means 50 provides both the stacking and destacking functions. However, similar robot arms may be prepared which are used only for stacking and only for destacking, respectively.

The inventive concept of the conveying system in accordance with the present invention also lies in the point that the above conveyance based on the trays and pods is invented to expand the range of conveyance conventionally limited to the interior of the inter-process conveying space C1 with a low cleanliness to the intra-process conveying space C0 with a high cleanliness, in order to improve the cleanliness of the conveyance as a whole as well as efficiency. With this regard, the conveying system in accordance with the present invention is a breakthrough against the conventional one.

In the above embodiment, the specific examples of the present invention have been described in detail. However, these are only illustrative and do not limit the claims. The technique described in the claims, that is, the technical scope of the present patent invention, embraces variations or modifications of the above specific examples as appropriately described herein.

The conveying system in accordance with the present invention can be used in industrial fields that need to perform efficient conveyance by using trays each accommodating one workpiece, as basic conveying means, and fully utilizing this advantage of the trays to allow its conveyance form to be changed as required.

While the present invention has been described with respect to preferred embodiments thereof, it will be apparent to those skilled in the art that the disclosed invention may be modified in numerous ways and may assume many embodiments other than those specifically set out and described above. Accordingly, it is intended by the appended claims to cover all modifications of the present invention that fall within the true spirit and scope of the invention.

The invention claimed is:

1. A conveying system, comprising:
   a single-pod conveying means for conveying pods one by one,
   a pod stacking means for stacking a plurality of pods,
   a stacked pod conveying means for conveying the stacked pods,
   a pod destacking means for destacking the stacked pods, and
   a tray loading and unloading means for loading and unloading a plurality of stacked trays into and from one of said plurality of pods.

2. The conveying system according to claim 1, further comprising a tray stacking and destacking means for stacking a plurality of trays or destacking the plurality of stacked trays.

3. A conveying system, comprising:
   a single-pod conveying means for conveying pods one by one,
   a pod stacking means for stacking a plurality of pods,
   a stacked pod conveying means for conveying the stacked pods,
   a pod destacking means for destacking the stacked pods, and
   a tray stacking and destacking means for stacking a plurality of trays or destacking the plurality of stacked trays.

4. A conveying system comprising:
   a single-pod conveying means for conveying pods one by one,
   a pod stacking and destacking means for stacking and destacking a plurality of pods,
   a stacked pod conveying means for conveying the stacked pods, and
   a tray loading and unloading means for loading and unloading a plurality of stacked trays into and from one of said plurality of pods.

5. The conveying system according to claim 4, further comprising a tray stacking and destacking means for stacking a plurality of trays or destacking the plurality of stacked trays.

6. A conveying system comprising:
   a single-pod conveying means for conveying pods one by one,
   a pod stacking and destacking means for stacking and destacking a plurality of pods,
   a stacked pod conveying means for conveying the stacked pods, and
   a tray stacking and destacking means for stacking a plurality of trays or destacking the plurality of stacked trays.

7. The conveying system according to claim 6, further comprising a tray loading and unloading means for loading and unloading said plurality of stacked trays into and from one of said plurality of pods.

* * * * *